United States Patent [19]

Chevali et al.

[11] 4,182,608
[45] Jan. 8, 1980

[54] PHOTOFLASH LAMP UNIT UTILIZING RADIATION AND VOLTAGE RESPONSIVE SWITCH DEVICES

[75] Inventors: Harihar D. Chevali; Thomas A. Evans, both of Mentor, Ohio

[73] Assignee: General Electric Company, Schenectady, N.Y.

[21] Appl. No.: 856,274

[22] Filed: Dec. 1, 1977

[51] Int. Cl.² ............................................... F21K 5/02
[52] U.S. Cl. ................................... 431/359; 252/503; 252/507; 252/512; 252/514; 252/520
[58] Field of Search ................ 431/359; 252/503, 512, 252/507, 520, 514

[56] References Cited

U.S. PATENT DOCUMENTS

| | | | |
|---|---|---|---|
| 3,532,931 | 10/1970 | Cote et al. | 431/359 |
| 3,969,065 | 7/1976 | Smialek | 431/359 |
| 3,988,647 | 10/1976 | Bolon et al. | 431/359 |
| 3,990,833 | 11/1976 | Holub et al. | 431/359 |
| 3,994,664 | 11/1976 | Cusano | 431/359 |
| 4,080,155 | 3/1978 | Sterling | 431/359 |

Primary Examiner—Carroll B. Dority, Jr.
Attorney, Agent, or Firm—John F. McDevitt; Lawrence R. Kempton

[57] ABSTRACT

A photoflash lamp unit is described having a plurality of flash lamps fired individually and in sequence to include a plurality of solid state switching devices each capable of being converted from a high electrical resistance to a low electrical resistance upon activation by either radiant energy or a high voltage pulse. The switch material composition comprises an admixture of a metallic silver source with a sufficient amount of a metal containing material to convert the switch to said low electrical resistance state by the high voltage pulse customarily employed to flash the individual lamps. In this manner, the switch device can be more reliably converted to the conductive state if not already completely converted by radiant energy supplied from an adjacent flash lamp and so provide a conductive path in the electrical circuit.

15 Claims, 2 Drawing Figures

PHOTOFLASH LAMP UNIT UTILIZING RADIATION AND VOLTAGE RESPONSIVE SWITCH DEVICES

BACKGROUND OF THE INVENTION

A plurality of solid state switching devices useful in multiple flash photo lamp units is described in U.S. Pat. No. 3,994,664, assigned to the assignee of the present invention, wherein a parallel electrical connection of either radiation responsive or voltage responsive switching devices serves to permit reliable sequential firing of the flash lamps connected in the electrical circuit. In the described arrangement, the desired sequential firing of the flash lamps is not aborted if a lamp becomes accidentally detatched or otherwise becomes open circuited. A suitable radiation responsive switching element for use in said arrangement is disclosed in U.S. Pat. No. 3,990,833, also assigned to the present assignee, which is characterized as a high relative humidity resistant of a mass composition comprising a metallic silver source and a humidity resistant organic polymer binder, said silver source comprising silver oxide with a carbon containing silver salt. The separate voltage responsive switching elements for use in this manner are also characterized as a mass of switch material which can interconnect a pair of spaced apart electrical terminals and with said voltage responsive switch material including copper oxide dispersed in an organic polymer binder in order to exhibit an irreversible change in electrical resistance from a high resistance state to a low resistance state upon application of a voltage in excess of a selectable threshold voltage. Understandably, the separate response characteristic provided by these individual switching elements unduly complicates the electrical circuit providing a desired sequential firing operation.

CROSS REFERENCE TO RELATED APPLICATIONS

A related high voltage type flash lamp unit is disclosed in copending patent application Ser. No. 822,449, filed Aug. 8, 1977, in the name of Dominic A. Cusano et al, and now U.S. Pat. No. 4,118,758, and assigned to the present assignee. In said high voltage flash lamp array, there is employed radiation responsive switch devices utilizing an active switch material which undergoes exothermic chemical conversion sufficient to interrupt the circuit path in the electrical circuit by thermal decomposition. A switch material disclosed as operating in this manner can comprise a mixture of silver oxide and cuprous oxide as the active constituents which is dispersed in an organic polymer binder to provide an adherent mass for deposition on the circuit board member.

In a further related copending patent application, Ser. No. 778,993, filed Mar. 18, 1977, in the name of Vaughn C. Sterling, and now U.S. Pat. No. 4,080,155, and also assigned to the present assignee, there is also disclosed an improved solid state switching device for actuation by the radiant energy being emitted from an adjacent flash lamp. This switch material composition comprises an admixture of a carbon containing silver salt and silver oxide which further contains a non-conductive particulate solid, such as glass beads, to help reduce the violence of the desired switch operation. More particularly, the particulate solids serve in preserving the physical integrity of the switch device during conversion to a conductive state by minimizing physical cracks and other modes of failure which could produce an open circuit path in the electrical circuit.

SUMMARY OF THE INVENTION

It is an object of the present invention to provide an improved photoflash lamp unit utilizing solid state switching elements in the form of a switch material which is both radiation responsive as well as voltage responsive and thereby provide a still more reliable switching operation. Still another important object of the present invention is to provide such dual responsive switch material for general use as a conductive element in the sequential flashing of a high-voltage activated multiple photoflash unit wherein said switching elements are deposited on a circuit board member and electrically connected in the sequential lamp firing circuitry.

In accordance with a preferred embodiment of the present invention, we have provided a photoflash lamp unit which includes a plurality of flash lamps, a circuit board with an electrical circuit into which said lamps are arranged to fire individually and in sequence, and a plurality of solid state switching devices as part of the electrical circuit, with each of said switching devices being located adjacent one of the lamps to receive radiant energy being emitted therefrom for conversion from a relatively high resistance (off condition) to a relatively low electrical resistance (on condition). We have discovered that a particular switch material composition for such use can also be converted to a relatively low electrical resistance state when the high voltage firing pulse customarily employed to fire the individual flash lamps is applied across the electrical terminals connecting these switching elements in the electrical circuit. The present switch material composition permits switching elements constructed from a mass of said material to provide a circuit path across the spaced apart terminals not only when the adjacent flash lamp is flashed but also when the adjacent lamp fails to flash due to high breakdown defects in order to flash the next succeeding unflashed lamp in the electrical circuit. It is possible in this manner to provide successive shunt paths in the electrical circuit around any flash lamps which fail to ignite and is not shorted.

The present switch material composition which reliably operates in the foregoing manner comprises an admixture of a metallic silver source with a sufficient amount of a metal containing material to convert the switch device to a low electrical resistance upon application of the high voltage firing pulse. The metallic silver source in said switch material composition comprises a carbon containing silver salt alone or a mixture of said silver salt with silver oxide having sufficient sensitivity to convert reliably when the lamp associated therewith is flashed. The voltage responsive metal containing material in said switch material composition can be selected from those metals and metal compounds which exhibit the prerequisite voltage breakdown and electrical resistance characteristics in the switch material composition before conversion and which do not impede the thermochemical conversion of the switch device to a low resistance state when the switch is actuated by radiation emitted from an adjacent flash lamp. Nearly all conductive metal containing materials can be made to exhibit breakdown voltage characteristics when used as particulate solids and surrounded by a dielectric material. Specifically, aluminum, copper, iron, lead, molybdenum, nickel, niobium, tin, tantalum, titanium, titanium hydride, and zirconium are examples of said metal containing materials. The choice of the metal containing material is further characterized by requiring it to provide stable performance when admixed and used in preferred radiation switch formulations, in order to provide long term maintenance of breakdown voltages and switch dielectric and resistive characteristics.

The dielectric characteristics for a typical switching device according to the present invention can be further defined in connection with a preferred photoflash lamp unit wherein the particular high voltage type flash lamp construction provides an open circuit condition after flashing. This general photoflash lamp unit is described in the aforementioned U.S. Pat. No. 3,990,833 to include the circuit board member and radiation responsive solid state switching devices for sequential firing of the associated high voltage flash lamps. For satisfactory switching operation with the high voltage flash lamps in current use, it is required that the radiation responsive switching elements exhibit an electrical resistance before actuation of at least $10^8$ ohms or greater together with an electrical resistance after conversion of about $10^3$ ohms or less. A further requirement upon the dielectric characteristics of the switching device in said preferred embodiment is dictated by firing pulse energy considerations. The available energy from presently used piezoelectric sources can convert the switch device from a high electrical resistance to a low electrical resistance path in the electrical circuit at breakdown voltage levels in the approximate range 800–1400 volts. The after breakdown resistance should be $10^4$ ohms or less in said preferred embodiment. All of the foregoing electrical characteristics can be satisfied in accordance with the present invention for titanium metal if the switch material composition contains approximately 10–40% by weight of said metal containing material constituent since a lesser amount of this constituent raises the breakdown voltage characteristics above the desired operating range whereas an excess amount lowers the voltage breakdown characteristic below said range. Particle size of the metal containing material can also influence the voltage breakdown characteristics.

For the switching devices constructed in accordance with the present invention to reliably provide a low resistance circuit path when actuated by radiant energy supplied from an adjacent flash lamp, it is also necessary to avoid such an overly vigorous thermochemical conversion that the switches could be blown off the circuit board member. It has now been found that incorporation of non-conductive particulate solids, such as glass beads, in the present switch material composition as above defined can serve as one means to avoid this problem. A different manner of ameliorating the blast effect of thermochemical conversion for the present switch material composition which does not require further additives involves selection of the particular silver source, metal containing material, and organic polymer binder for the admixture as well as relative weight proportions of these constituents in said admixture. In this regard, it is already recognized that use of silver oxide alone as the silver source produces an overly vigorous conversion which is prone to damaging the circuit board or the electrical circuit. Since the nature and degree of thermochemical conversion for the present switching devices will also be dictated at least in part by the actual amount of heat and/or light to which the switching devices are subjected when activated by an adjacent flash lamp, still other factors such as size of the flash lamps employed and proximate location of the switching devices with respect thereto can further influence the desired mode of operation. Consequently, the proper selection of the above material constituents and their weight proportions in a specific switch material formulation to provide the degree of thermochemical sensitivity can be determined in a routine manner from all of the foregoing considerations.

DESCRIPTION OF THE PREFERRED EMBODIMENTS

Figure 1:
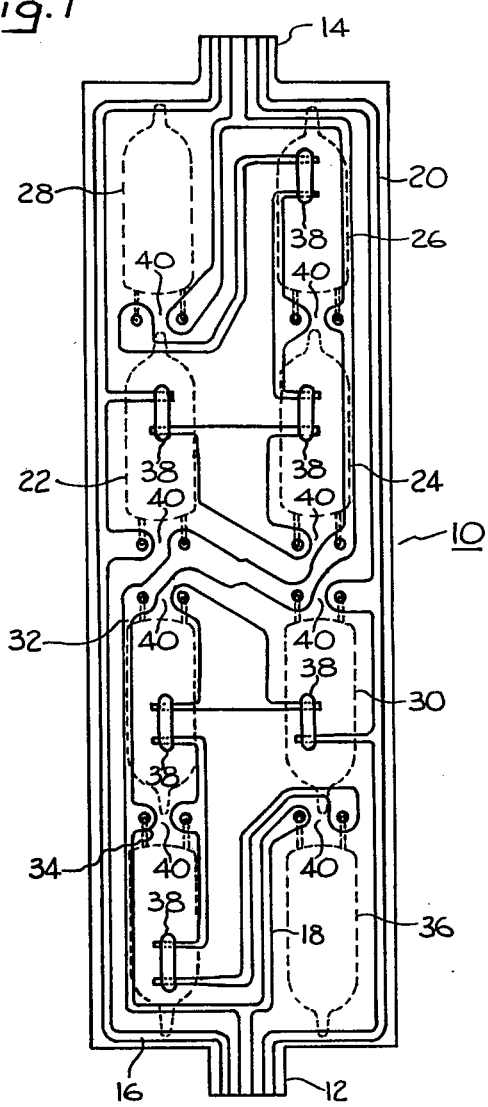
FIG. 1 is a top view of a circuit board member utilizing the present switching device in the electrical circuit of a photoflash unit.

Referring now to the drawings, the circuit arrangement of FIG. 1 is generally the same as disclosed in the above referenced U.S. Pat. No. 3,990,833 which includes circuit board member 10 having connector tabs 12 and 14 located at each end for insertion of the circuit board member in an associated camera socket (not shown). The camera socket has contacts for conductor lines 16, 18 and 20 on the circuit board to connect four flash lamps 22–28 in parallel between conductor lines 16 and 18 to an energy source for a high voltage pulse (not shown) when connector tab 12 has been inserted in the camera socket. Correspondingly, the remaining group of four lamps 30–36 is connected between conductor lines 18 and 20 to said energy source when connector tab 14 has been inserted in the camera socket. Conductor lines 16 and 20 are interrupted by switching devices of the present invention 38 to prevent the flash lamps in the group from all being fired together on the release of the camera shutter. It can be noted the switches 38 are each arranged in the regions of flash lamp termination 40 so that heat and light released when an adjoining flash lamp is fired operates to convert the respective switch by thermochemical action from a non-conductive to an electrically conductive state, thus establishing a current path to the next lamp to be flashed. The further ability of said switching devices 38 to be converted by application of a high voltage firing pulse across the electrical terminals connecting said switching devices in the electrical circuit enables the same current path to be established to the next lamp if the associated flash lamp fails to ignite due to a non-short condition.

As can be noted from reference to said FIG. 1 circuit embodiment, the switch devices 38 are serially connected between the individual branch circuits established by parallel connection of the individual flash lamps to the source of high voltage firing pulses. The same voltage pulse being applied to flash a particular lamp in the same group of lamps operatively connected to said energy source can also convert the switching device to a low resistance circuit path if the particular lamp fails to flash due to a non-short condition. In this manner, a sequential firing of the remaining unflashed lamps in the connected lamp group is accomplished by application of succeeding voltage pulses. By not connecting the individual switch devices 38 in the branch circuits so as to have a parallel connection relationship with the source of high voltage pulses, as was the practice in previous known photoflash unit circuits, it is also not possible when applying a voltage firing pulse to flash more than a single lamp simultaneously.

Figure 2:
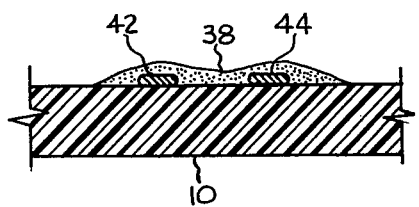
FIG. 2 is a cross sectional view through a single switch and the connecting electrical terminals shown in FIG. 1.

FIG. 2 shows an enlarged cross section of the switch devices 38 in FIG. 1 which is a typical construction in accordance with the present invention. A pair of spaced apart electrical terminals 42 and 44 for said switch device 38 are deposited on the circuit board member 10. The switch device 38 can be applied to the circuit board as a coating which interconnects the terminals 42 and 44 so as to provide an electrical circuit path therebetween when said coating is converted to the conductive state. Such conversion occurs from heat and/or light radiation being emitted when the adjacent lamp is flashed or from application of the same or a successive high voltage energy pulse being applied to flash the lamp. Successive conversion of the switching devices 38 in this manner enables all lamps of a particular lamp group to be flashed in sequence except for certain defective lamps in said lamp group. In depositing the switches on the circuit board member between the electrical terminals, conventional coating techniques may be used which can require presence of an organic diluent or solvent. Useful solvents can be selected which are conventionally employed in silk screening. The switch material ink for deposition can be formed by mixing the silver source and metal containing material as a dry blend and adding the organic polymer binder along with a selected solvent to form a slurry. This liquid ink may be applied across the terminals for the switch by conventional means as a thin coating and preferably by silk screening techniques. The performance characteristics of specific switch material compositions according to the present invention are illustrated by the following examples reported in Table I below:

TABLE I

| Ex. | Metal Containing Material | Wt. % | Glass Beads | Wt. % | Breakdown Voltage (Volts) | Initial Resistance (ohms) | Final Resistance (ohms) |
|---|---|---|---|---|---|---|---|
| 1 | Ti | 30 | 30μ | 12.7 | 416 | $>10^8$ | $<10^3$ |
| 2 | Ti | 24 | 30μ | 5.4 | 1257 | $>10^8$ | $<10^3$ |
| 3 | Ti | 15 | 30μ | 5.5 | 2188 | $>10^8$ | $<10^3$ |
| 4 | TiH$_2$ | 24 | 30μ | 0.0 | 1738 | $>10^8$ | $<10^3$ |
| 5 | TiH$_2$ | 28 | 30μ | 2.7 | 749 | $>10^8$ | $<10^3$ |
| 6 | TiH$_2$ | 31.6 | 30μ | 10.5 | 681 | $>10^8$ | $<10^3$ |

As can be noted, the above listed switch formulations all contain various amounts of non-conductive particulate solids, e.g.; glass beads which help ameliorate the blast effect of thermochemical conversion when the switch element is activated by radiation from an adjacent flash lamp. As previously mentioned, said switch materials tend to undergo vigorous reaction in this manner and the glass beads have been found effective in precluding such decomposition as interrupts the circuit path. Each of the above switch formulations were prepared by incorporating the disclosed proportions of particular metal containing material and glass beads in a typical switch ink having 304 gms. silver carbonate, 76 gms. silver oxide, 26.6 gms. surfactant solution (57 wt. % solids), 48.4 gms. organic polymer binder solution (20 wt. % solids), 49.6 gms. organic solvent, and 11 gms. carbon powder paste (9 wt. % solids). A typical material composition as the final solid state switch and which does not necessarily include said non-conductive particulate solids is in parts by weight about 12 parts silver oxide, about 49 parts silver carbonate, about 25 parts powdered titanium metal, about 0.2 parts carbon, about 2.2 parts surfactant, and about 1.6 parts organic polymer binder.

The breakdown voltage values reported in Table I above were measured with a test instrument utilizing a high voltage, low current power supply and a microprocessor which computed the average breakdown voltage at switch failure to provide a digital readout. Accordingly, said instrument applied a high voltage pulse across the switch being tested and reported the peak voltage when the particular switch material broke down. The electrical resistance measurements reported in said Table were made with a conventional Triplet meter before and after these breakdown voltage tests. Further breakdown voltage measurements were conducted to determine stability of the switch devices to environment conditions. The switches were exposed to conditions of 96% relative humidity and a temperature of 120° F. for 14 days and the breakdown voltage measured as above indicated before and after such exposure. A switch material having 35 wt. % titanium metal and 25 wt. % glass beads in the same switch ink utilized in Examples 1-6 exhibited a breakdown voltage of 1057 volts before exposure and 916 volts breakdown following exposure. A switch material having 24 wt. % titanium hydride and 10 weight % glass beads in the same switch ink exhibited a breakdown voltage of 1137 volts before exposure and 337 volts breakdown voltage after the humidity exposure. From the latter tests it is evident that titanium metal is a preferred metal containing material in the particular switch ink as compared with titanium hydride.

It will also be evident from the foregoing description that various modifications can be made in the furnished example and illustrations without departing from the spirit and scope of the present invention. For example, the addition of glass beads in the present switch material compositions can be eliminated by suitable adjustment of the active constituents in accordance with the principles given above. Accordingly, it is intended to limit the present invention only by the scope of the following claims.

What we claim as new and desire to secure by United States Letters Patent is:

1. A radiation switch for a flash lamp unit which can convert from a high electrical resistance to a low electrical resistance when exposed to the radiation being emitted from a flash lamp disposed adjacent to the switch, said switch comprising an admixture of a metallic silver source with a sufficient amount of a metal containing material selected from the group consisting of titanium metal and titanium hydride to convert the switch to a low electrical resistance path upon application of a high voltage pulse when said adjacent flash lamp fails to flash.

2. A radiation switch as in claim 1 wherein said radiation switch comprises a mass of switch material interconnecting a pair of spaced apart electrical terminals.

3. A radiation switch as in claim 1 wherein said admixture further includes a humidity resistant organic polymer binder.

4. A radiation switch as in claim 1 wherein the metallic silver source comprises silver oxide and a carbon-containing silver salt.

5. A radiation switch as in claim 1 wherein the metal containing material is titanium metal.

6. A radiation switch as in claim 1 wherein the admixture contains in parts by weight about 12 parts silver oxide, about 49 parts silver carbonate, about 35 parts powdered titanium metal, about 0.2 parts carbon, about 2.2 parts surfactant, and about 1.6 parts organic polymer binder.

7. A photoflash unit comprising
   (a) a pair of flash lamps,
   (b) an electrical circuit into which said lamps are arranged to flash individually and in sequence, and
   (c) a radiation switch located external of the flash lamps and forming part of the electrical circuit, said radiation switch being located adjacent one of said flash lamps and disposed to receive radiant energy emitted by that lamp, said photoflash lamp unit being characterized by said radiation switch being a mass of switch material interconnected to a pair of spaced apart electrical terminals in the electrical circuit, said switch material comprising an admixture of a metallic silver source with a sufficient amount of a metal containing material selected from the group consisting of titanium metal and titanium hydride to convert the switch to a low electrical resistance path upon application of a high voltage pulse when said adjacent flash lamp fails to flash.

8. A photoflash unit as in claim 7 wherein said admixture further includes a humidity resistant organic polymer binder.

9. A photoflash unit as in claim 7 wherein the metallic silver source comprises silver oxide and a carbon containing silver salt.

10. A photoflash unit as in claim 7 wherein the metal containing material is titanium metal.

11. A photoflash unit as in claim 7 wherein the admixture contains in parts by weight about 12 parts silver oxide, about 49 parts silver carbonate, about 35 parts powdered titanium metal, about 0.2 parts carbon, about 2.2 parts surfactant, and about 1.6 parts organic polymer binder.

12. A photoflash unit for sequential firing of associated flash lamps which comprises:
   (a) an electrical circuit into which said lamps are connected to fire individually and in sequence,
   (b) a plurality of flash lamps connected in parallel branch circuits across the terminals of an energy source for a high voltage pulse, and
   (c) a plurality of combination radiation and voltage responsive switch devices each connected by common connection between the parallel connected branch circuits, each radiation switch being located adjacent one of said flash lamps and disposed to receive radiant energy emitted by that lamp, said photoflash unit being characterized by said radiation switch being a mass of switch material interconnected to a pair of spaced apart electrical terminals in the electrical circuit, said switch material comprising an admixture of a metallic silver source with a sufficient amount of a metal containing material selected from the group consisting of titanium metal and titanium hydride to convert the switch to a low electrical resistance path upon application of a high voltage pulse when said adjacent flash lamp fails to flash.

13. A photoflash unit as in claim 12 wherein said admixture further includes a humidity resistant organic polymer binder.

14. A photoflash unit as in claim 12 wherein the metallic silver source comprises silver oxide and carbon containing silver salt.

15. A photoflash unit as in claim 12 wherein the metal containing material is titanium metal.